United States Patent
Nakamura

(10) Patent No.: US 7,518,141 B2
(45) Date of Patent: Apr. 14, 2009

(54) MULTICOLOR ORGANIC LIGHT EMITTING APPARATUS

(75) Inventor: Naoto Nakamura, Isehara (JP)

(73) Assignee: Canon Kabushiki Kaisha, Tokyo (JP)

(*) Notice: Subject to any disclaimer, the term of this patent is extended or adjusted under 35 U.S.C. 154(b) by 216 days.

(21) Appl. No.: 11/691,682

(22) Filed: Mar. 27, 2007

(65) Prior Publication Data

US 2007/0228367 A1 Oct. 4, 2007

(30) Foreign Application Priority Data

Mar. 29, 2006 (JP) ............................. 2006-090537
Mar. 19, 2007 (JP) ............................. 2007-069971

(51) Int. Cl.
*H01L 35/24* (2006.01)
(52) U.S. Cl. ........... 257/40; 257/E51.018; 257/E51.022
(58) Field of Classification Search .................. 257/40, 257/E51.018, E51.022
See application file for complete search history.

(56) References Cited

U.S. PATENT DOCUMENTS

| 6,541,130 | B2 | 4/2003 | Fukuda ........................ 428/690 |
| 7,057,339 | B2* | 6/2006 | Boroson et al. ............. 313/504 |
| 7,224,114 | B2 | 5/2007 | Yamada et al. .............. 313/504 |
| 2006/0033425 | A1* | 2/2006 | Miura et al. ................ 313/504 |
| 2007/0286944 | A1* | 12/2007 | Yokoyama et al. ........... 427/66 |

FOREIGN PATENT DOCUMENTS

| JP | 2000-323277 | 11/2000 |
| JP | 2004-127795 | 4/2004 |

* cited by examiner

*Primary Examiner*—Trung Dang
(74) *Attorney, Agent, or Firm*—Fitzpatrick, Cella, Harper & Scinto

(57) ABSTRACT

Provided is a multicolor organic light emitting apparatus having a plurality of organic light emitting devices formed on a substrate, for emitting two or more types of luminescent colors. A thickness of a layer formed between a light emitting layer and a reflection surface of a cathode is the same as that of each of first and second organic light emitting devices, and an optical distance between a light emitting surface of each of the light emitting layers and the reflection surface of the cathode is adjusted such that each thickness of the light emitting layers is varied to enhance light emitted from the light emitting layers by optical interference.

40 Claims, 9 Drawing Sheets

MULTICOLOR ORGANIC LIGHT EMITTING APPARATUS

BACKGROUND OF THE INVENTION

1. Field of the Invention

The present invention relates to an organic light emitting device (organic electroluminescence device) for emitting light through energization of an organic layer including a light emitting layer formed between electrodes, and more particularly, to a multicolor organic light emitting apparatus having a plurality of organic light emitting devices formed on a substrate, for exhibiting two or more luminescent colors.

2. Description of the Related Art

In general, as a self-emitting device used for a display, a light source, or the like, an EL (electroluminescence) or an LED (light emitting diode) is known. Particularly, an organic light emitting device in which an organic compound material is used as a luminous body has been focused because it is possible to obtain luminance of several hundreds to 1,000 $Cd/m^2$ or more at a low voltage of about 10 V or less (when the device is DC driven).

Further, by appropriately selecting an organic compound material having emission spectrums corresponding to red (R), green (G), and blue (B), it is possible to produce an organic light emitting device for exhibiting three primary colors, and it is also possible to produce a full color display having a plurality of organic light emitting devices formed on a substrate with relative ease. From this point of view, at present, studies and development of the organic light emitting device are vigorously conducted.

However, a thickness of an organic layer of the organic light emitting device is the same as or less than that of an emission wavelength. Therefore, in order to obtain an organic light emitting device having a desirable luminous efficiency, it is necessary for the organic light emitting device to be designed in view of an influence of optical interference.

Accordingly, the following techniques are disclosed as a technique of optimally designing the organic light emitting device from an optical point of view.

Japanese Patent Application Laid-Open No. 2000-323277 discloses an organic electroluminescence multicolor display having a plurality of organic electroluminescence devices which is formed on a transparent substrate and in which a light emitting layer is made of a different material from the other, and which exhibits various luminescent colors. In addition, functional layers having the same function as that of the organic compound material layer other than the light emitting layer have thicknesses different from each other corresponding to each luminescent color. In other words, by varying each thickness of a hole transporting layer, an electron transporting layer, and the like for each luminescent color, optically optimum conditions for each luminescent color are satisfied.

Thus, Japanese Patent Application Laid-Open No. 2000-323277 describes that it is possible to provide an organic EL multicolor display having a desirable external light extraction efficiency with a simple method as compared with a conventional method of satisfying the optically optimum conditions by partially changing a thickness of an ITO anode.

Further, Japanese Patent Application Laid-Open No. 2000-323277 describes that a distribution of an emission intensity in the light emitting layer of the organic EL device formed of the organic compound material layer corresponds to an index function distribution with respect to a thickness, in which the emission intensity is strong on an interface on the hole transporting layer side, and the emission intensity decreases toward the electron transporting layer side. In addition, it is described that the interface on the hole transporting layer side is known as a light emitting interface having an emission intensity peak (see paragraph [0040]).

Further, Japanese Patent Application Laid-Open No. 2004-127795 discloses a display apparatus including a light emitting layer between a first electrode and a second electrode, and an organic light emitting device having a resonator structure in which light emitted from the light emitting layer is resonated between a first end portion and a second end portion. In addition, for respective organic light emitting devices for red emission, green emission, and blue emission, a maximum emission position of the light emitting layer and an optical distance between electrodes that sandwich the light emitting layer are defined. In this case, the thicknesses of the hole transporting layer, the light emitting layer, and the electron transporting layer of the organic light emitting devices for each color are different from each other, and all the thicknesses of the organic layers are adjusted (see paragraph [0045] to [0050])

Thus, Japanese Patent Application Laid-Open No. 2004-127795 describes that it is possible to obtain a relationship in which reflected light and generated light are mutually enhanced between the first end portion and the second end portion, which improves an extraction efficiency of light generated in the light emitting layer.

Further, Japanese Patent Application Laid-Open No. 2004-127795 describes that the organic light emitting device for red emission emits light on an interference on a side of the first electrode which is a anode, but the maximum emission position is on an interface on a side of the second electrode because the light emission on a side of the second electrode which is a cathode is larger than that on the first electrode side. The organic light emitting devices for green emission and blue emission emits little light on the side of the second electrode which is a cathode, so the maximum emission position is on the interface on the side of the first electrode which is a anode (see paragraph [0031]).

However, in both the organic EL multicolor display described in Japanese Patent Application Laid-Open No. 2000-323277 and the display apparatus described in Japanese Patent Application Laid-Open No. 2004-127795, the thicknesses of the hole transporting layer and the electron transporting layer are varied, which are unnecessary to be varied for each luminescent color if the optical interference between the light emitting layer and the reflecting electrode is not utilized. As a result, there arises a problem in that the number of manufacturing processes is drastically increased. In addition, it is necessary to severely control an alignment accuracy of a mask necessary for varying the thickness for each luminescent color, and an impurity or the like generated when the mask is exchanged, which leads to a reduction of a yield. Because of those problems, it is extremely difficult to vary each thickness of the layers having the same functions for each luminescent color in an actual manufacturing process. As a result, there is a demand for improving the external light extraction efficiency for each luminescent color by varying each thickness of the layers for each luminescent color not with the structure described in Japanese Patent Application Laid-Open No. 2000-323277 or Japanese Patent Application Laid-Open No. 2004-127795 but with a simpler structure.

SUMMARY OF THE INVENTION

To solve the above-mentioned problems, it is an object of the present invention to provide a multicolor organic light emitting apparatus capable of improving an external light extraction efficiency for each luminescent color with a simpler structure by utilizing optical interference between a light emitting layer and a reflecting electrode without variation of a thickness of a hole transporting layer or an electron transporting layer for each luminescent color.

In order to solve the above-mentioned problems of the related art, according to an aspect of the present invention, there is provided a multicolor organic light emitting apparatus of a top-emission type, including: a substrate; and a plurality of organic light emitting devices which is formed on the substrate and includes a first organic light emitting device for exhibiting a first luminescent color and a second organic light emitting device for exhibiting a second luminescent color which is different from the first luminescent color, in which: the first organic light emitting device includes a light reflective cathode, an organic compound layer which contains a light emitting layer having an electron transportability, and a light transmissive anode formed in the stated order from a side of substrate; the second organic light emitting device includes a light reflective cathode, an organic compound layer containing a light emitting layer which has an electron transportability and is formed with a material and a thickness different from those of the light emitting layer of the first organic light emitting device, and a light transmissive anode formed in the stated order from the side of the substrate; a thickness of a layer formed between the light emitting layer and a reflection surface of the cathode is the same as that of each of the first organic light emitting device and the second organic light emitting device; and an optical distance between a light emitting surface of each of the light emitting layers and the reflection surface of the cathode is adjusted such that each thickness of the light emitting layers is varied to enhance light emitted from the light emitting layers by optical interference.

According to another aspect of the present invention, there is provided a multicolor organic light emitting apparatus of a bottom-emission type, including: a substrate; and a plurality of organic light emitting devices which is formed on the substrate and includes a first organic light emitting device for exhibiting a first luminescent color and a second organic light emitting device for exhibiting a second luminescent color which is different from the first luminescent color, in which: the first organic light emitting device includes a light transmissive cathode, an organic compound layer which contains a light emitting layer having a hole transportability, and a light reflective anode formed in the stated order from a side of the substrate; the second organic light emitting device includes a light transmissive cathode, an organic compound layer containing a light emitting layer which has a hole transportability and is formed with a material and a thickness different from those of the light emitting layer of the first organic light emitting device, and a light reflective anode formed in the stated order from the side of the substrate; a thickness of a layer formed between the light emitting layer and a reflection surface of the anode is the same as that of each of the first organic light emitting device and the second organic light emitting device; and an optical distance between a light emitting surface of each of the light emitting layers and the reflection surface of the anode is adjusted such that each thickness of the light emitting layers is varied to enhance light emitted from the light emitting layers by optical interference.

Further, according to still another aspect of the present invention, there is provided a multicolor organic light emitting apparatus of a top-emission type, including: a substrate; and a plurality of organic light emitting devices which is formed on the substrate and includes a first organic light emitting device for exhibiting a first luminescent color and a second organic light emitting device for exhibiting a second luminescent color which is different from the first luminescent color, in which: the first organic light emitting device includes a light reflective anode, an organic compound layer which contains a light emitting layer having a hole transportability, and a light transmissive cathode formed in the stated order from a side of the substrate; the second organic light emitting device includes a light reflective anode, an organic compound layer containing a light emitting layer which has a hole transportability and is formed with a material and a thickness different from those of the light emitting layer of the first organic light emitting device, and a light transmissive cathode formed in the stated order from the side of the substrate; a thickness of a layer formed between the light emitting layer and a reflection surface of the anode is the same as that of each of the first organic light emitting device and the second organic light emitting device; an optical distance between a light emitting surface of each of the light emitting layers and the reflection surface of the anode is adjusted such that each thickness of the light emitting layers is varied to enhance light emitted from the light emitting layers by optical interference.

Further, according to still another aspect of the present invention, there is provided a multicolor organic light emitting apparatus of a bottom-emission type, including: a substrate; and a plurality of organic light emitting devices which is formed on the substrate and includes a first organic light emitting device for exhibiting a first luminescent color and a second organic light emitting device for exhibiting a second luminescent color which is different from the first luminescent color, in which: the first organic light emitting device includes a light transmissive anode, an organic compound layer which contains a light emitting layer having an electron transportability, and a light reflective cathode formed in the stated order from a side of the substrate; the second organic light emitting device includes a light transmissive anode, an organic compound layer containing a light emitting layer which has an electron transportability and is formed with a material and a thickness different from those of the light emitting layer of the first organic light emitting device, and a light reflective cathode formed in the stated order from the side of the substrate; a thickness of a layer formed between the light emitting layer and a reflection surface of the cathode is the same as that of each of the first organic light emitting device and the second organic light emitting device; and an optical distance between a light emitting surface of each of the light emitting layers and the reflection surface of the cathode is adjusted such that each thickness of the light emitting layers is varied to enhance light emitted from the light emitting layers by optical interference.

According to the present invention, in the multicolor organic light emitting apparatus, only the thickness of each of the light emitting layers is adjusted for each luminescent color at the time of selective coating and formation of each light emitting layer for each color, which is necessary for multicolor, so it is possible to easily optimize an optical distance between a light emitting surface of each of the light emitting layers and a reflection surface of a light reflective electrode.

Therefore, it is possible to improve the external light extraction efficiency without a particularly complicated process, which is effective in that luminance is improved.

In addition, higher luminance can be obtained with respect to the same input power, which is effective in that power consumption is reduced.

Further features of the present invention will become apparent from the following description of exemplary embodiments with reference to the attached drawings.

DESCRIPTION OF THE EMBODIMENTS

Figure 1:
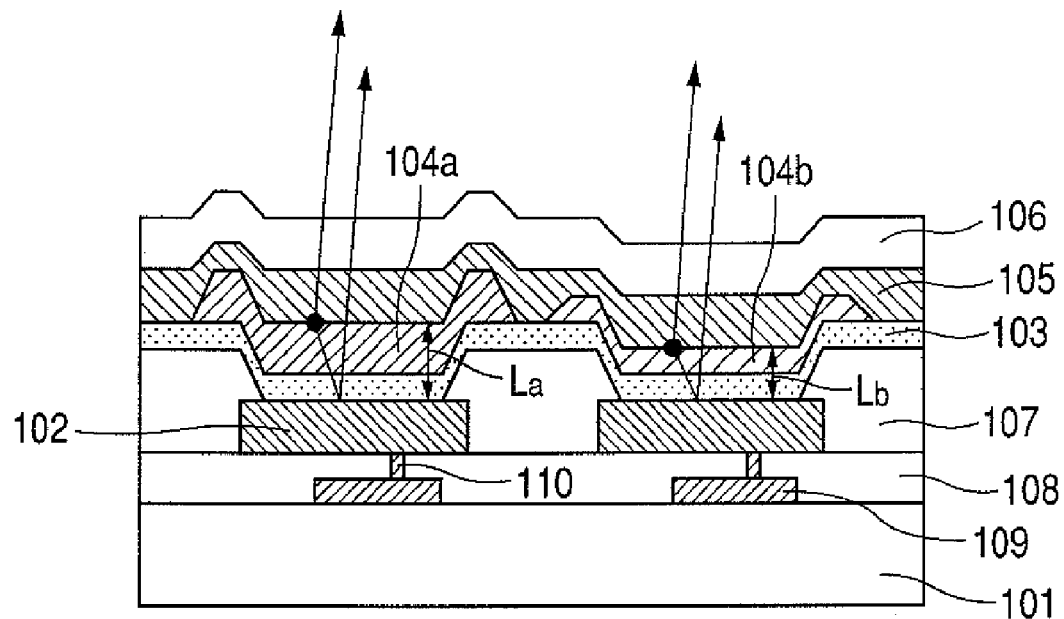
FIG. 1 is a sectional schematic view of a multicolor organic light emitting apparatus according to a first embodiment of the present invention.

A multicolor organic light emitting apparatus according to the present invention includes a substrate and a first organic light emitting device for exhibiting a first luminescent color and a second organic light emitting device for exhibiting a second luminescent color which is different from the first luminescent color that are formed on the substrate. The first organic light emitting device includes a first electrode, an organic compound layer containing a light emitting layer, and a second electrode that are formed in the stated order from the substrate side. The second organic light emitting device includes a first electrode, an organic compound layer containing a light emitting layer having a material different from that of the light emitting layer of the first organic light emitting device, and a second electrode that are formed in the stated order from the substrate side.

In a case of an organic light emitting apparatus of a so-called top-emission type in which light emitted from the light emitting layer is extracted from a side opposite to a substrate side, the first electrode has light reflectivity and the second electrode has light transmittance. On the other hand, in a case of an organic light emitting apparatus of a so-called bottom-emission type in which light emitted from the light emitting layer is extracted from the substrate side, the first electrodes has light transmittance and the second electrode has light reflectivity. In other words, in the top-emission organic light emitting apparatus, the first electrode serves as a reflection surface to cause optical interference, and in the bottom-emission organic light emitting apparatus, the second electrode serves as the reflection surface. In this case, the term "light reflectivity" indicates reflection of incident light without transmission thereof as in a case of reflection of light on a surface of a metal. A light reflective electrode may be a single metal electrode layer, or may have laminated structure in which a transparent conductive layer is laminated on a side of an organic compound layer of a metal layer. The term "light transmittance" indicates transmittance of incident light and includes reflection and absorption of partial light. An example of a light transmissive electrode includes a transparent metal oxide such as ITO or IZO and a metal thin film having a thickness of about 1 nm to 20 nm.

According to the present invention, the light extraction efficiency is enhanced through adjustment of an optical distance between the reflection surface and the light emitting surface of the light emitting layer. According to the present invention, the optical distance between the reflection surface and the light emitting surface of the light emitting layer can be adjusted by varying only the thickness of the light emitting layer which conventionally requires selective coating depending on the luminescent color. Specifically, it is unnecessary to vary the thickness of an organic compound layer such as an electron transporting layer or a hole transporting layer, which is located between the reflection surface and the light emitting layer, depending on the luminescent color. Thus, it is possible to manufacture an organic light emitting apparatus without increasing the number of processes for adjustment of the optical distance, and it is also possible to provide an organic light emitting apparatus with a simpler structure and high light extraction efficiency.

According to the present invention, the term "light emitting surface" indicates a portion having the highest emission intensity in a thickness direction of the light emitting layer. In general, light emission occurs not only on the light emitting surface, but the light emitting layer has an emission intensity distribution in the thickness direction of the light emitting layer. The term is thus defined because, in a case where the light extraction efficiency is enhanced by utilizing the optical interference, it is desirable to adjust the optical distance by setting a position where the emission intensity is highest as a reference. The inventor of the present invention presume that the light emitting surface of the light emitting layer is generally determined mainly by a carrier transporting characteristic of a light emitting layer. In other words, when the light emitting layer has an electron transportability, the light emitting surface is an interface on an anode side, and when the light emitting layer has a hole transportability, the light emitting surface is an interface on a cathode side. The electron transportability and the hole transportability are defined by a correlation between an electron mobility and a hole mobility of the light emitting layer (which includes a case where a material having a high electron mobility or a high hole mobility is doped in a host material). Specifically, when the electron mobility is relatively higher than the hole mobility, the light emitting layer has the electron transportability, and when the hole mobility is relatively higher than the electron mobility, the light emitting layer has the hole transportability.

The optical distance is defined as a product (n×d) of a refractive index (which is represented by n) of a medium through which light travels and a distance (d) by which light travels. In the organic light emitting device, light emitted from the light emitting layer travels through a film such as an organic layer or a transparent electrode, so the term "optical film thickness" is also used to indicate the optical distance. In addition, terms such as an optical path difference and an optical length are used to indicate the optical distance in the above-mentioned related art.

According to the present invention, when a structure in which the light emitting layer is formed between the reflection surface and the light emitting surface is adopted, the light emitting layer can be used for adjustment of the optical distance. The structure is obtained in the following four cases. That is: (1) a case where the first electrode is a light reflective cathode, the light emitting layer has an electron transportability, and the second electrode is a light transmissive anode (first embodiment); (2) a case where the first electrode is a light transmissive cathode, the light emitting layer has a hole transportability, and the second electrode is a light reflective electrode (second embodiment); (3) a case where the first electrode is a light reflective anode, the light emitting layer has a hole transportability, and the second electrode is a light transmissive electrode (third embodiment); and (4) a case where the first electrode is a light transmissive anode, the light emitting layer has an electron transportability, and the second electrode is a light reflective electrode (fourth embodiment).

Hereinafter, first to fourth embodiments will be described with reference to FIGS. 1 to 4.

Figure 2:
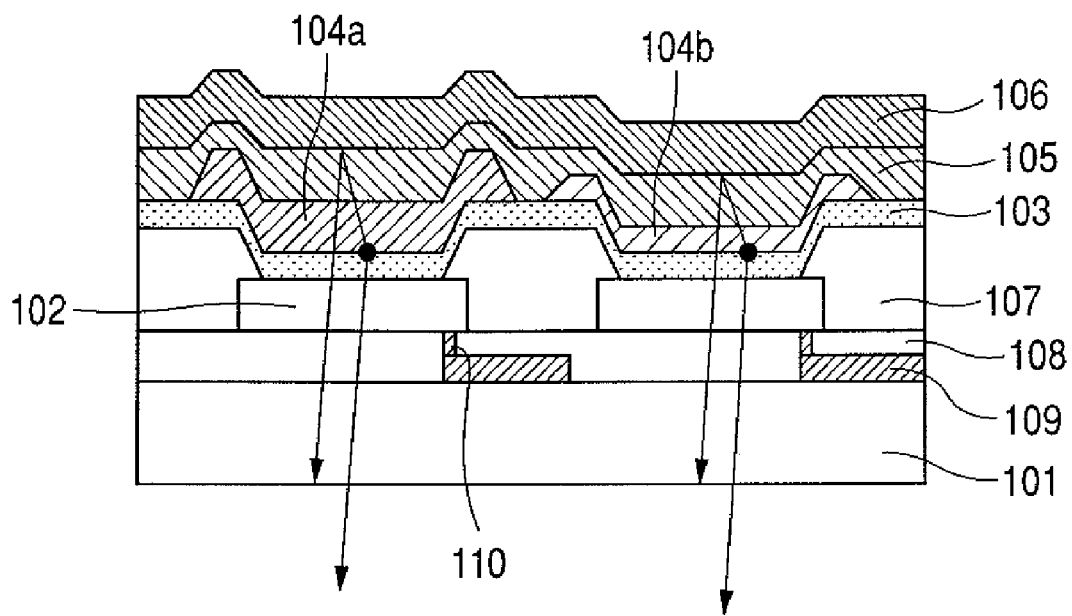
FIG. 2 is a sectional schematic view of a multicolor organic light emitting apparatus according to a second embodiment of the present invention.
Figure 3:
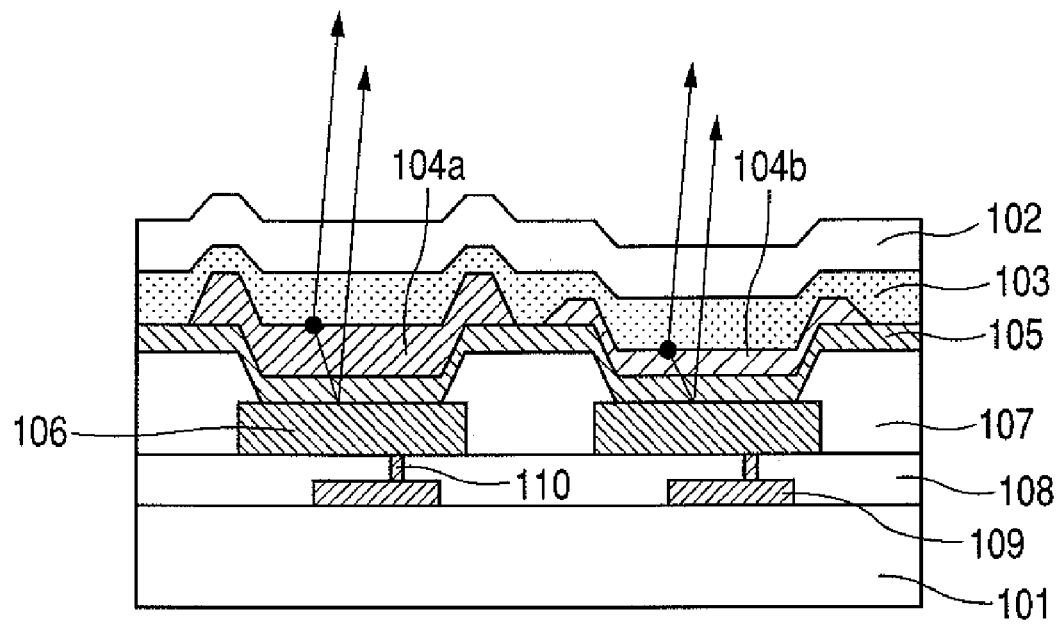
FIG. 3 is a sectional schematic view of a multicolor organic light emitting apparatus according to a third embodiment of the present invention.
Figure 4:
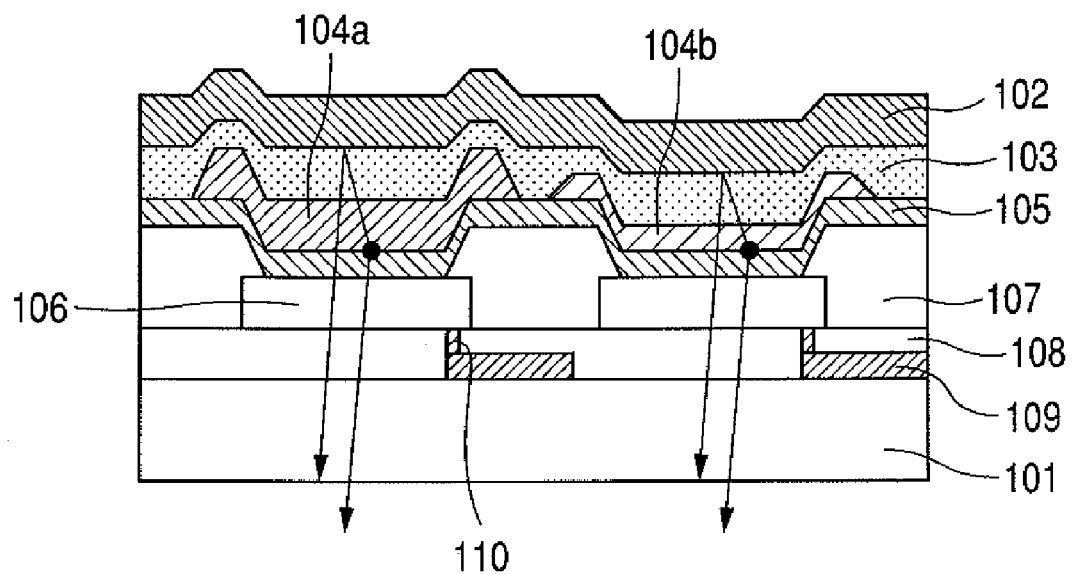
FIG. 4 is a sectional schematic view of a multicolor organic light emitting apparatus according to a fourth embodiment of the present invention.

FIG. 1 is a sectional schematic view illustrating a multicolor light emitting device according to the first embodiment of the present invention. FIGS. 2 to 4 are sectional schematic views illustrating multicolor organic light emitting devices according to the second to fourth embodiments, respectively. In FIGS. 1 to 4, the multicolor organic light emitting device includes a substrate 101, a cathode 102, an electron transporting layer 103, light emitting layers 104 (104a and 104b), a hole transporting layer 105, an anode 106, a device separating layer 107, a planarization layer 108, TFTs (thin film transistors) 109, and contact holes 110.

In the multicolor organic light emitting apparatus shown in FIG. 1, the TFTs 109 are formed on the substrate 101 to correspond to each of the organic light emitting devices, and the planarization layer 108 for planarizing irregularities formed by the TFTs 109 is formed on the TFTs 109. In the planarization layer 108, there are formed the contact holes 110 for connecting an electrode of the TFT 109 and an electrode of the organic light emitting device. On each of the contact holes 110, the light reflective cathode 102 is formed by being patterned for each organic light emitting device, and the device separating layer 107 is formed between the cathodes 102 so as to cover end portions of the cathodes 102. On the cathodes 102 and the device separating layer 107, the electron transporting layer 103 is continuously formed over the cathodes 102. The light emitting layers 104a and 104b which have an electron transportability and whose materials and thicknesses are different from each other, are formed on portions from each of which the cathode 102 is exposed. On the light emitting layer 104, the hole transporting layer 105 is formed over the cathodes 102. In addition, on the hole transporting layer 105, the light transmissive anode 106 is continuously formed over the cathodes 102. The electron transporting layer 103, the hole transporting layer 105, the anode 106 that are continuously formed have a slight film thickness unevenness due to irregularities of a lower layer, but organic light emitting device portions each have the same thickness. A portion which emits light of the light emitting layer 104 sandwiched by the cathode 102 and the anode 106 serves as one organic light emitting device. In this case, the light emitting layer 104a exhibits a first luminescent color (e.g., green), and the light emitting layer 104b exhibits a second luminescent color (e.g., blue) which is different from the first luminescent color. Hereinafter, a description will be given with reference to FIG. 1, but in FIGS. 2 to 4, it is possible to obtain the same structure as that of FIG. 1 except for a lamination order of the anode and the cathode, and a light extraction direction.

The light emitting surfaces are portions indicated by ● of the figure. The light extraction efficiency is enhanced through adjustment of an optical distance L between the light emitting surface and the reflecting position of the cathode 102 which is a reflective electrode. Optical distances $L_a$ and $L_b$ between the light emitting surface and the reflecting position of the cathode 102 which is a reflective electrode desirably satisfy the following expression (1). When the optical distance L satisfies the expression (1), light emitted from the light emitting layer can be extracted at a maximum.

$$2L = n\lambda + (\Phi/2\pi)\lambda \quad (1)$$

where n represents a positive integer, $\Phi$ represents a phase shift on the reflection surface of the light reflective electrode, and $\lambda$ represents a peak wavelength of a PL spectrum of the light emitting layer 104.

In this embodiment, the organic compound layer is formed of the electron transporting layer 103, the light emitting layers 104, and the hole transporting layer 105, but the present invention is not particularly limited to the structure. For example, an electron injecting layer (not shown) may be formed between the cathode 102 and the electron transporting layer 103, and a hole injecting layer (not shown) may be formed between the anode 106 and the hole transporting layer 105. Alternatively, it is possible to employ a structure in which one of the electron injecting layer and the hole transporting layer is excluded.

FIGS. 1 to 4 illustrate the structure including two types of organic light emitting devices that exhibit different luminescent colors, but the organic light emitting apparatus according to the present invention may include another organic light emitting device for exhibiting a third luminescent color (e.g., red) in addition to the two types of organic light emitting devices. In a case where the organic light emitting apparatus according to the present invention includes the organic light emitting device for exhibiting the third luminescent color, a layer formed between the light emitting layer and a reflection surface of the electron transporting layer or the hole transporting layer of the third organic light emitting device may not necessarily have the same thickness as that of each of the organic light emitting devices for exhibiting the first luminescent color and the second luminescent color. It is desirable that the layer formed between the reflection surface and the light emitting layer of the organic light emitting device for exhibiting the third luminescent color have the same thickness as that of each of the organic light emitting devices for exhibiting the first luminescent color and the second luminescent color, because the organic compound layers other than the light emitting layer such as the electron transporting layer can be formed at the same time without performing selective coating. Further, when the organic light emitting apparatus according to the present invention includes the organic light emitting device for exhibiting the third luminescent color, and three luminescent colors are red, green, and blue, the organic light emitting apparatus can be desirably used as a full color display. The multicolor organic light emitting apparatus of the present invention as the full color display can be desirably used as a television receiver, a PC monitor, a display of a cellular phone or a back display of a digital camera. The organic light emitting device for exhibiting two luminescent colors can also be used as an area color display. The multicolor organic light emitting apparatus of the present invention as the area color display can be desirably used as a display of a car navigation system or a display of a portable music player.

In addition, in a bottom-emission multicolor organic light emitting apparatus of the present invention in which light is extracted from the substrate 101 side as in the second and fourth embodiments, it is desirable that the TFTs 109 are not located immediately below the first electrode on the substrate side, but are located under the device separating layer 107 as shown in FIGS. 2 and 4. This is because, in the case of the bottom-emission multicolor organic light emitting apparatus, when the TFTs 109 are located immediately below the first electrode on the substrate side, the light emitted from the light emitting layer 104 is blocked.

Further, in the multicolor organic light emitting apparatus of the present invention, when the electrode formed on the substrate side is a cathode as in the first and second embodiments, the TFTs are n-channel type transistors. In the case of the n-channel type transistor, the semiconductor layer which forms the TFT is made of an amorphous silicon. When the TFT is made of an amorphous silicon, which can cope with a light emitting apparatus with a larger display, the multicolor organic light emitting apparatus of the present invention can be desirably used as a television receiver or a PC monitor.

Hereinafter, examples of the multicolor organic light emitting apparatus according to the present invention will be described. However, the present invention is not particularly limited to the following examples.

EXAMPLE 1

A structure of the multicolor organic light emitting apparatus according to the present invention and a manufacturing process thereof will be described with reference to the drawings. In the following examples, a description is given of a case of manufacturing a full color multicolor organic light emitting device having a plurality of organic light emitting devices for exhibiting three primary colors of R, G, and B formed on a substrate. The multicolor organic light emitting apparatus of this example includes three organic light emitting devices. Alternatively, it is possible to achieve an organic light emitting apparatus having more than three organic light emitting devices in the same manner.

Figure 5:
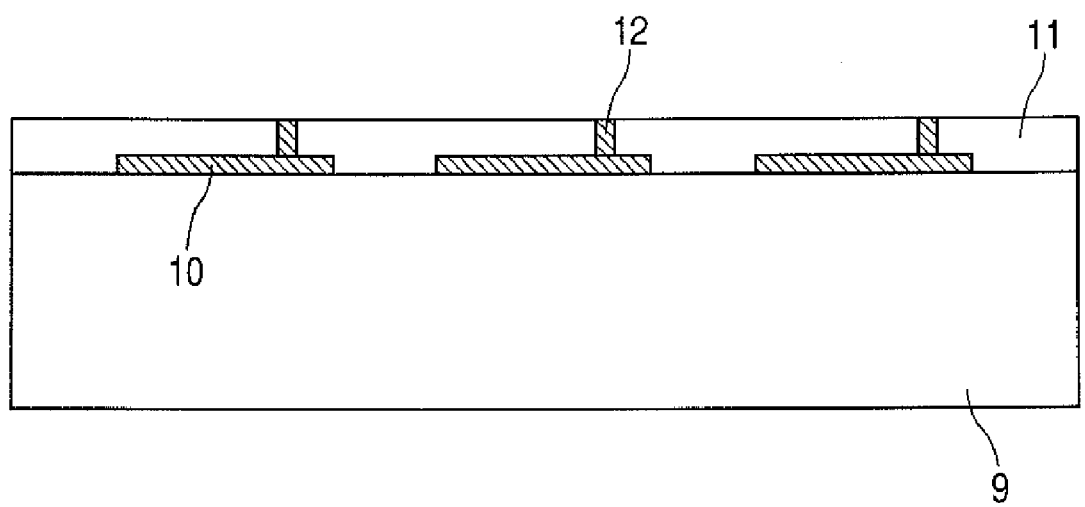
FIG. 5 is a sectional view for explaining a manufacturing process of a multicolor organic light emitting apparatus according to Example 1 of the present invention.

On a substrate 9 made of glass or the like, amorphous-silicon TFTs (thin film transistors) 10 which are semiconductor layers for driving a plurality of organic light emitting devices (see FIG. 5). On the substrate 9, there is formed a planarization layer 11 made of an organic material, for planarizing irregularities formed by the TFTs 10. In the planarization layer 11, there are formed a large number of contact holes 12 for electrically connecting an output terminal of the TFT 10 and a lower electrode of the organic light emitting device, and each of the contact holes 12 is buried with a conductive material.

In this example, driving of the organic light emitting device is performed by setting a lower electrode side of the organic light emitting device to be negative (cathode) and an upper electrode side thereof to be positive (anode). For this reason, even when a plurality of TFTs 10 for driving one organic light emitting device is used, a TFT 10 which becomes a final output terminal to which the lower electrode is electrically connected is an n-channel type transistor.

Figure 6:
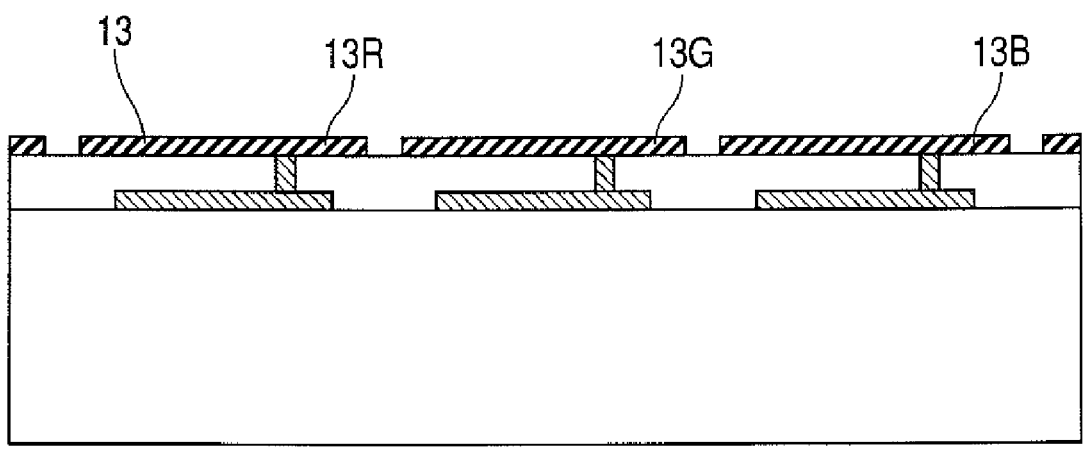
FIG. 6 is a sectional view for explaining the manufacturing process of the multicolor organic light emitting apparatus according to Example 1 of the present invention.

On the substrate 9, patterning is performed using a shadow mask to form an Al layer having a thickness of 100 nm by EB vapor deposition, thereby forming light reflective cathodes (hereinafter, referred to simply as "cathode") 13 (see FIG. 6). Patterning was performed such that cathodes 13R, 13G, and 13B are respectively formed at positions where the lower electrodes of the organic light emitting devices for each color are to be formed. Hereinafter, the lower electrode and the cathode represent the same electrode, and are denoted by the same reference symbols.

Figure 7:
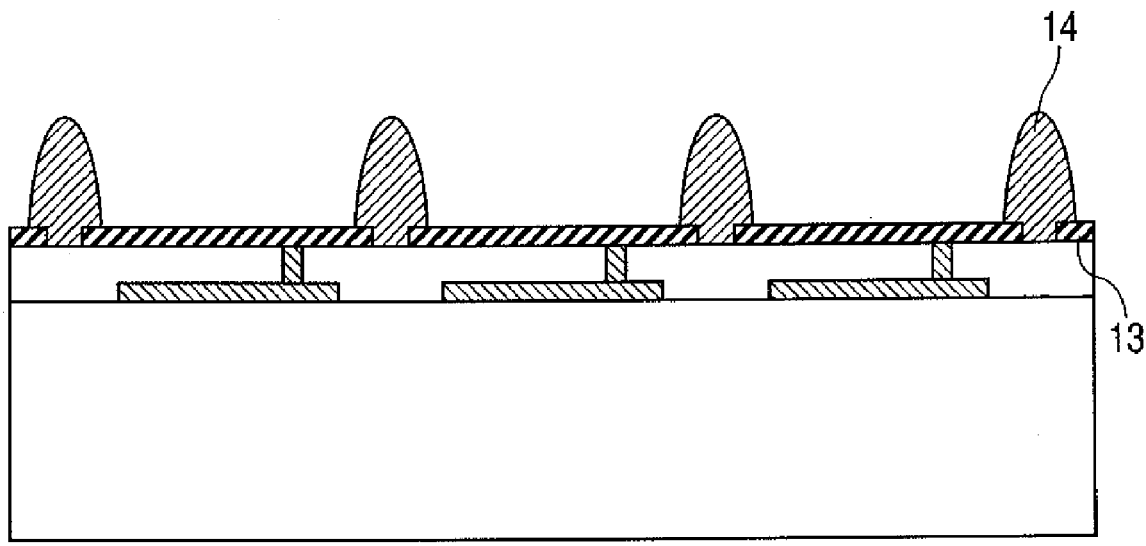
FIG. 7 is a sectional view for explaining the manufacturing process of the multicolor organic light emitting apparatus according to Example 1 of the present invention.

On each of the cathodes 13, a device separating layer 14 formed of polyimide is formed by being patterned so as to form an opening in each of the cathodes 13, with a thickness of 150 nm (see FIG. 7). The device separating layer 14 is formed for the purpose of, for example, preventing such color mixing as mixing of different colors of the light emitting layers in isolation parts for each color from occurring in a process of forming the light emitting layers for each color to be described later, or reducing short circuit or leakage caused between the lower electrode and the upper electrode in the isolation parts for each color. In addition, when the light emitting layer is formed on each of the cathodes 13 by mask vapor deposition, a non-opening portion of the mask is placed on the device separating layer 14. Accordingly, the device separating layer 14 is formed so as to prevent the vapor-deposited light emitting layer from being damaged with the masks. When the pattern formation is performed with a mask placed on the device separating layer 14, it is necessary to set a thickness of the device separating layer 14 to be as thick as about 200 nm or more to prevent a film formation part from being damaged.

On each of the cathodes 13, an LiF film (not shown) having a thickness of 0.5 nm is formed as an electron injecting layer by vacuum vapor deposition. Pattern formation of the electron injecting layer is performed using a shadow mask, but the electron injecting layer is not required to be subjected to patterning for each of the respective organic light emitting devices for corresponding colors, and the electron injecting layer may be formed with the same thickness over the plurality of organic light emitting devices.

Figure 8:
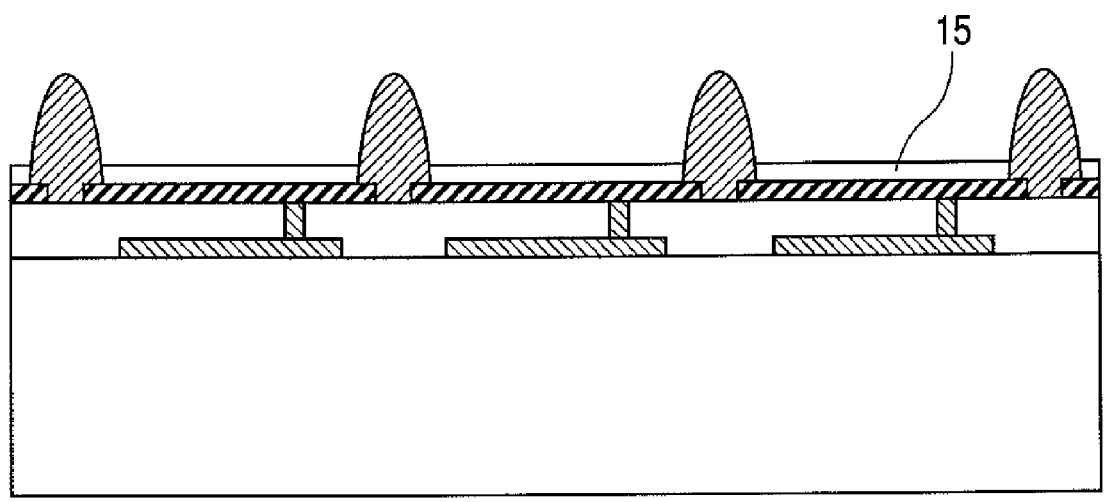
FIG. 8 is a sectional view for explaining the manufacturing process of the multicolor organic light emitting apparatus according to Example 1 of the present invention.

On each of the cathodes 13, a tris(8-quinolinolato)aluminum (hereinafter, referred to simply as "Alq") film having a thickness of 20 nm is formed as the electron transporting layer 15 by a vacuum vapor deposition method (see FIG. 8). Pattern formation of the electron transporting layer 15 is performed using a shadow mask, but the electron transporting layer 15 may not be subjected to patterning for the respective organic light emitting devices for corresponding colors, and the electron injecting layer 15 may be formed with the same thickness over a plurality of organic light emitting devices.

Figure 9:
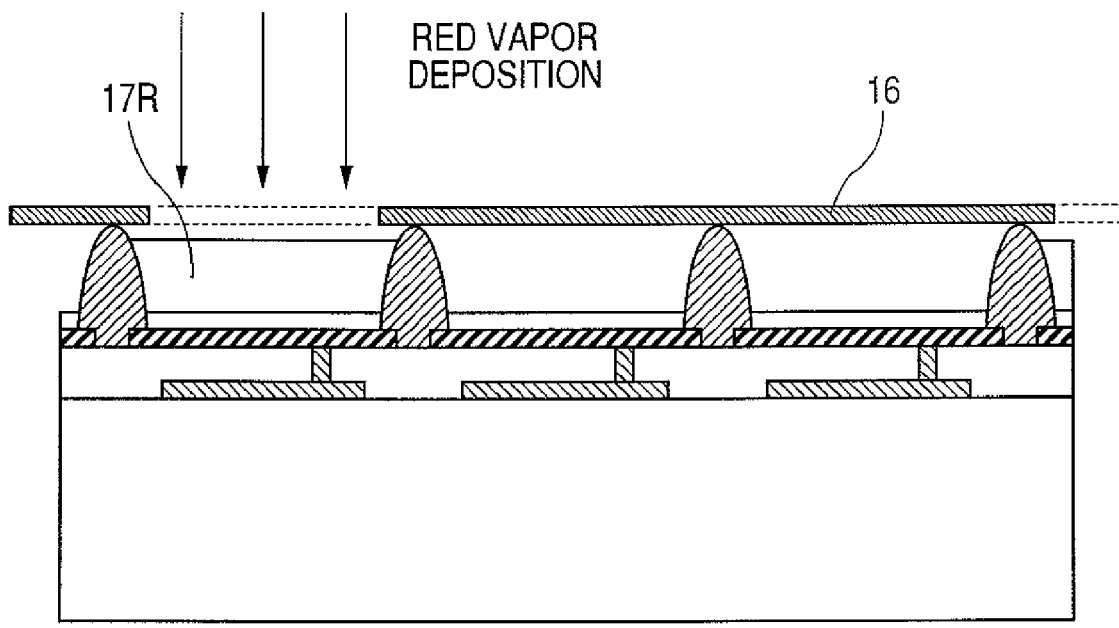
FIG. 9 is a sectional view for explaining the manufacturing process of the multicolor organic light emitting apparatus according to Example 1 of the present invention.

On the electron transporting layer 15, light emitting layers 17R, 17G, and 17B for respective colors are formed (see FIG. 9). The light emitting layers 17R, 17G, and 17B are formed by being subjected to patterning with a shadow mask 16 having mask openings corresponding to color forming units for the respective colors by vacuum vapor deposition with a light emitting layer material.

Specifically, after positioning of an opening portion of the shadow mask 16 is performed, the light emitting layer 17R is formed by vacuum vapor deposition (see FIG. 9). As a material for the light emitting layer 17R, a material obtained by subjecting Alq to co-deposition from the vapor using 4-(dicyanomethylene)-2-methyl-6-(p-dimethylaminostyryl)-4H-pyrane as a dopant is used. A non-opening portion of the shadow mask 16 is placed on the device separating layer 14 as shown in FIG. 9.

Figure 10:
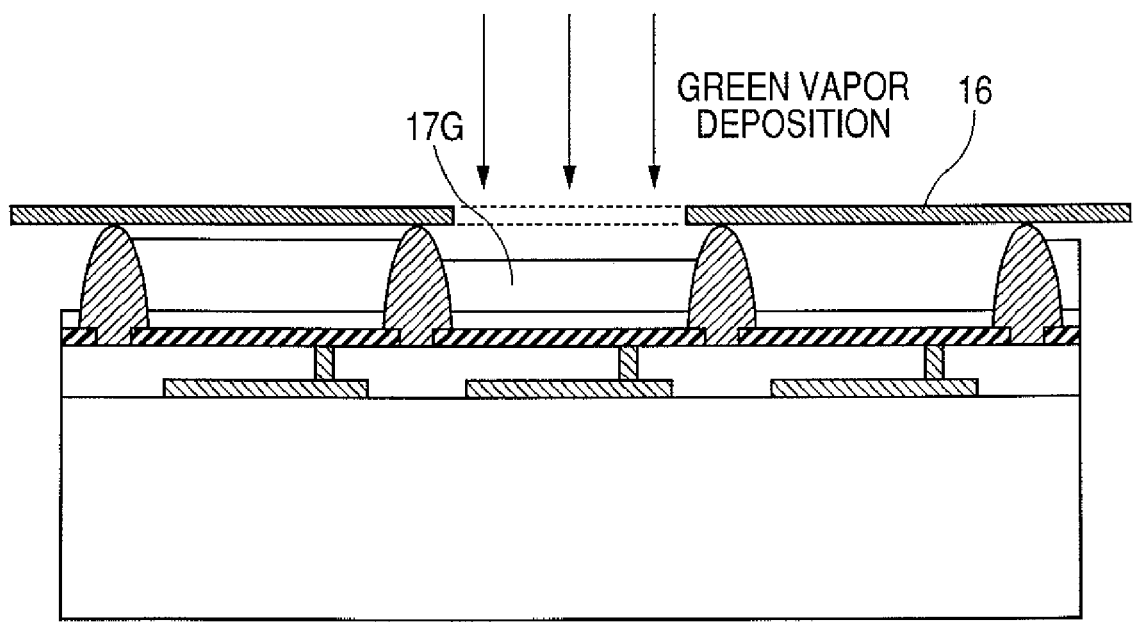
FIG. 10 is a sectional view for explaining the manufacturing process of the multicolor organic light emitting apparatus according to Example 1 of the present invention.

After movement and positioning of the opening portion of the shadow mask 16 to the position where the subsequent color is to be formed, the light emitting layer 17G is formed by vacuum vapor deposition in the same manner as the light emitting layer 17R (see FIG. 10). As a material for the light emitting layer 17G, a material obtained by subjecting Alq to co-deposition from the vapor using quinacridone (hereinafter, referred to simply as "Qc") as a dopant is used.

After that, the light emitting layer 17B is formed, but the process thereof is the same as those of the light emitting layers 17R and 17G, so a process diagram is omitted. As a material for the light emitting layer 17B, 4, 4'-bis(2',2-diphenylvinyl) biphenyl is used.

The multicolor organic light emitting apparatus of the present invention optimizes an optical distance between a light emitting surface (which is a portion of the light emitting layer having the strongest emission intensity) and a reflection surface of each of the cathodes 13, by varying each thickness of the light emitting layers 17R, 17G, and 17B for the respective colors. Thus, each thickness of the light emitting layers 17R, 17G, and 17B is an important factor. Specifically, it is necessary to set each thickness of the light emitting layers 17R, 17G, and 17B so that light (direct light) emitted from the light emitting surface to the upper electrode side and light (reflected light) reflected on the reflection surface of the cathode 13 are mutually enhanced by interference, in order to enhance the light extraction efficiency.

Figure 15:
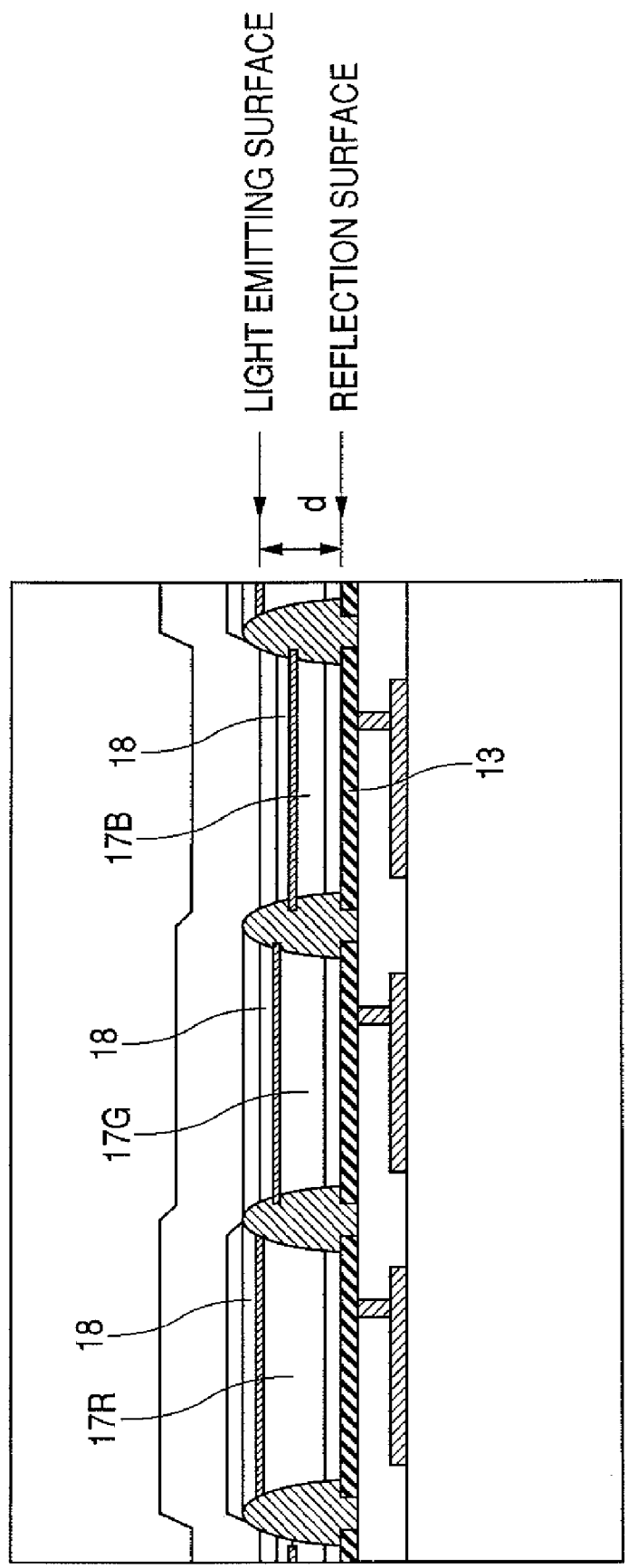
FIG. 15 is a sectional view for explaining an optical distance according to Example 1 of the present invention.

As regards the materials used in this example, it is possible that each light emitting surface substantially matches an interface between each of the light emitting layers 17R, 17G, and 17B and the hole transporting layer 15 (which corresponds to portions indicated by the heavy lines of FIG. 15, and an emission intensity thereof is exponentially attenuated according to a distance from the interface).

The light emitting layers 17R, 17G, and 17B are extremely thin (100 nm or less) and have a high light transmission, so the light emitting layers 17R, 17G, and 17B are assumed to be transparent (light transmissive) in terms of optical design. With this assumption, the optical distance of each of the light emitting layers 17R, 17G, and 17B is a product of each thickness of the light emitting layers 17R, 17G, and 17B and its refractive index. As layers which are formed between the light emitting surface and the reflection surface of the cathode 13, there are the light emitting layer 17R (17G, 17B), the electron transporting layer 15, and the electron injecting layer. Among those layers, the electron injecting layer may be ignored because the layer is extremely thin.

The light emitting layers 17R, 17G, and 17B each have a refractive index of about 1.8, so the optical distance (d) from each light emitting surface for R, G, and B to each reflection surface is 1.8 times the sum of the thickness of the light emitting layer and the thickness of the electron transporting layer.

In this case, optical conditions in which the reflected light and the direct light are mutually enhanced can be obtained from the following expression (2) (where m is an integer equal to or larger than 1) when it is assumed that the wavelength of light emission is represented by $\lambda$, and the refractive index is represented by n (a phase is shifted by $\pi$). Note that the expression (2) is obtained when a phase shift of the expression (1) is represented by $-\pi$.

$$2nd=(1/2)\lambda \times (2m-1) \text{ That is, } nd=(1/4)\lambda \times (2m-1) \quad (2)$$

In other words, when the optical distance (d) from the light emitting surface of each of organic EL devices for the respective colors to the reflection surface is substantially the same as an odd-number multiple of a value which is 1/4 times as large as the peak wavelength ($\lambda$) for the corresponding luminescent color, the direct light and the reflected light are mutually enhanced by interference, with the result that the external light extraction efficiency can be enhanced.

As a result, when it is assumed that the thickness of the light emitting layer 17R is represented by $T_{Red}$, the thickness of the light emitting layer 17G is represented by $T_{Green}$, and the thickness of the light emitting layer 17B is represented by $T_{Blue}$, each thickness of the light emitting layers 17R, 17G, and 17B can be obtained by the following expressions (where h is an integer equal to or larger than 1).

$$d_{Red} \approx (T_{Red}+20) \times 1.8 \approx \lambda_{Red}/4 \times (2h-1)$$

$$d_{Green} \approx (T_{Green}+20) \times 1.8 \approx \lambda_{Green}/4 \times (2h-1)$$

$$d_{Blue} \approx (T_{Blue}+20) \times 1.8 \approx \lambda_{Blue}/4 \times (2h-1)$$

As peak wavelengths ($\lambda$) of the respective luminescent colors, $\lambda_{Red}$ is about 620 nm, $\lambda_{Green}$ is about 530 nm, and $\lambda_{Blue}$ is about 470 nm.

Assuming that h is 1 in this example, setting is performed such that the thickness of the light emitting layer 17R is 65 nm, the thickness of the light emitting layer 17G is 55 nm, and the thickness of the light emitting layer 17B is 45 nm.

As in this example, only by setting the lower electrode to the cathode 13 and the upper electrode 20 (see FIG. 13) to the anode, and by varying each thickness of the light emitting layers 17R, 17G, and 17B for the respective colors, it is possible to optimize the optical distance from the light emitting surface to the reflection surface and enhance the luminance.

Figure 11:
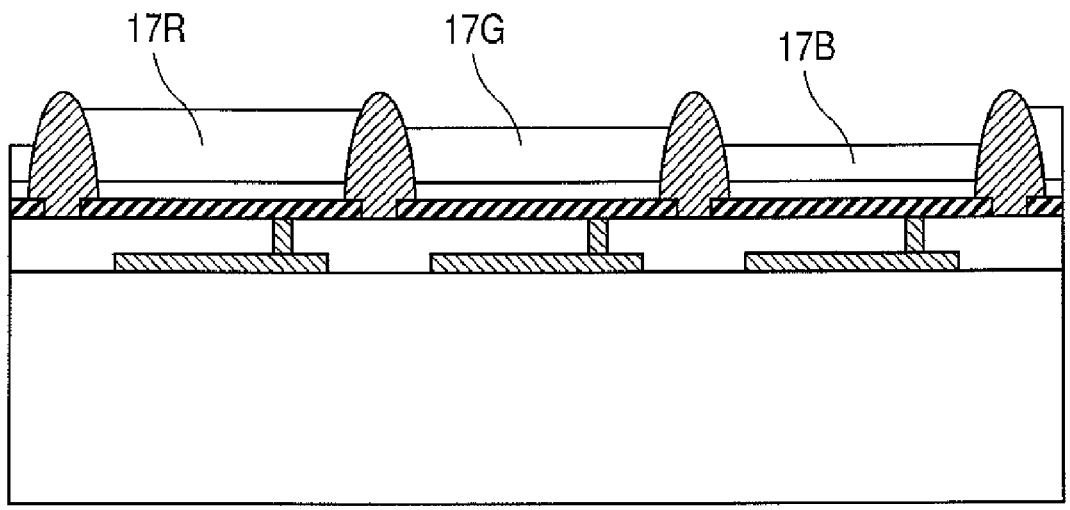
FIG. 11 is a sectional view for explaining the manufacturing process of the multicolor organic light emitting apparatus according to Example 1 of the present invention.

As described above, the light emitting layers 17R, 17G, and 17B for the respective colors are formed (see FIG. 11).

The light emitting layers 17 are formed in the order of the light emitting layers 17R, 17G, and 17B in this example, but the light emitting layers 17 may not necessarily be formed in this order. The order may be appropriately changed depending on the material or the apparatus to be used. Further, in this example, the light emitting layers 17R, 17G, and 17B are formed by moving and positioning the opening of the shadow mask 16. Alternatively, shadow masks for the respective colors which correspond to R, G, and B may be prepared in advance and only the positioning of openings of the shadow masks for the respective colors may be performed without moving the shadow masks, to thereby form the light emitting layers 17R, 17G, and 17B.

Figure 12:
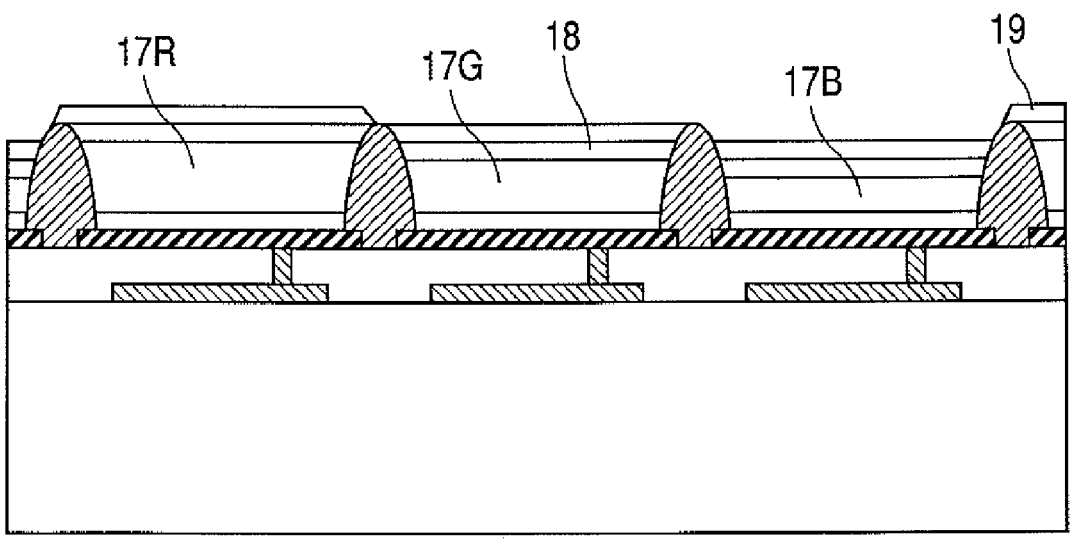
FIG. 12 is a sectional view for explaining the manufacturing process of the multicolor organic light emitting apparatus according to Example 1 of the present invention.

On the light emitting layers 17R, 17G, and 17B, a 4,4-bis (N-(1-naphthyl)-N-phenylamino)biphenyl film having a thickness of 40 nm is formed as a hole transporting layer 18 by vacuum vapor deposition (see FIG. 12).

On the hole transporting layer 18, a copper phthalocyanine film having a thickness of 40 nm is formed as a hole injecting layer 19 by vacuum vapor deposition. As a result, the electron injecting layer, the electron transporting layer 15, the light emitting layer 17, the hole transporting layer 18, and the hole injecting layer 19 constitute the organic layer.

As a protective layer (not shown) used in formation of the upper electrode by sputtering, a vanadium oxide ($V_2O_5$) film having a thickness of 15 nm is formed by EB vapor deposition.

The hole transporting layer 18, the hole injecting layer 19, and the protective layer may be commonly formed over the organic EL devices for multiple colors. Alternatively, a shadow mask may be used to perform pattern formation.

Figure 13:
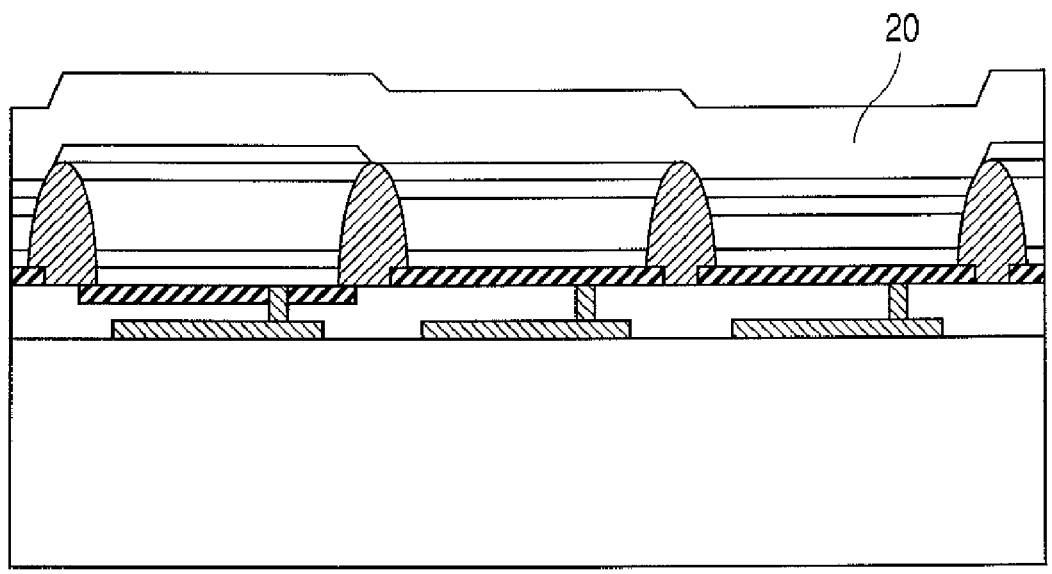
FIG. 13 is a sectional view for explaining the manufacturing process of the multicolor organic light emitting apparatus according to Example 1 of the present invention.

The light transmissive upper electrode 20 is formed (see FIG. 13). The upper electrode 20 is formed of an In—Zn—O film (hereinafter, referred to simply as "IZO film") having a thickness of 100 nm by a sputtering method. As a target used in formation of the IZO film, a target of In/(In+Zn)=0.83 is used. Formation of the IZO film is performed under the conditions of an atmosphere of mixed gas of $Ar:O_2$, a degree of vacuum of 1 Pa, and a sputtering output of 0.2 W/cm$^2$. The upper electrode 20 formed of the IZO film functions as a anode.

Figure 14:
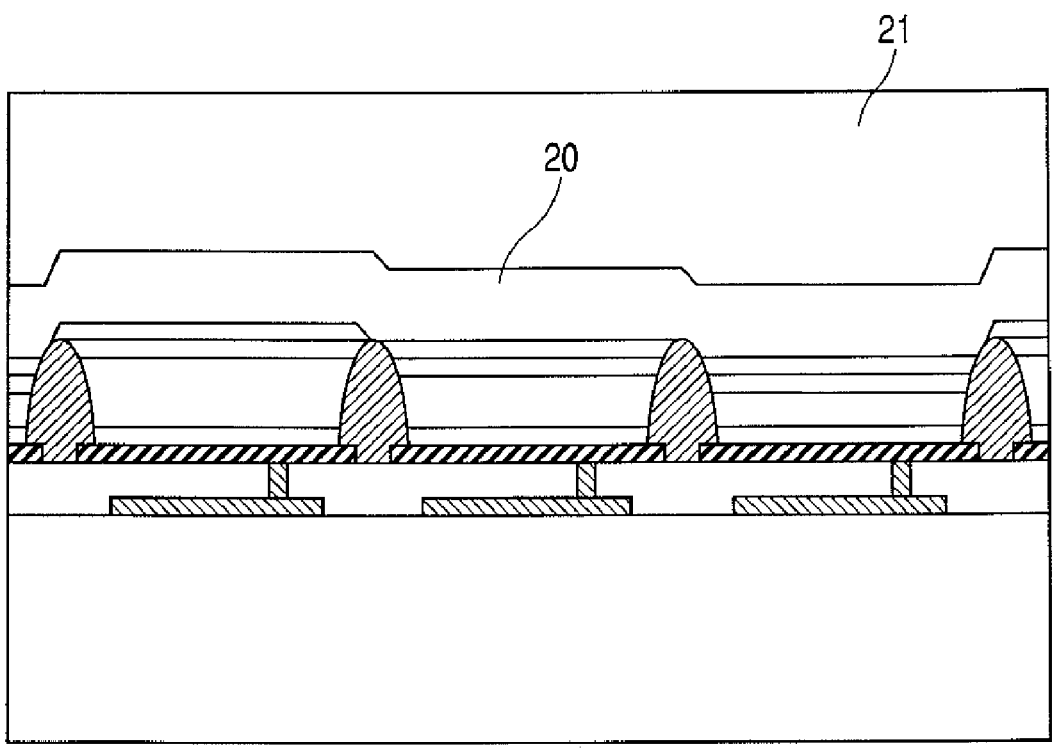
FIG. 14 is a sectional view for explaining the manufacturing process of the multicolor organic light emitting apparatus according to Example 1 of the present invention.

A sealing film 21 made of $SiN_4$ is formed on the upper electrode 20 with a thickness of 1 μm so as to block the entrance of the external air into the organic light emitting device, with the result that a multicolor organic light emitting apparatus having a plurality of organic light emitting devices for emitting light of three primary colors is completed (see FIG. 14). In addition, in order to enhance the ability to block the external air, by bonding glass onto the multicolor organic light emitting apparatus formed with the $SiN_4$ film, an airtight container may be produced. In a structure of the airtight container obtained through bonding of glass, a getter for absorbing water or oxygen may be provided in the container.

EXAMPLE 2

Figure 16:
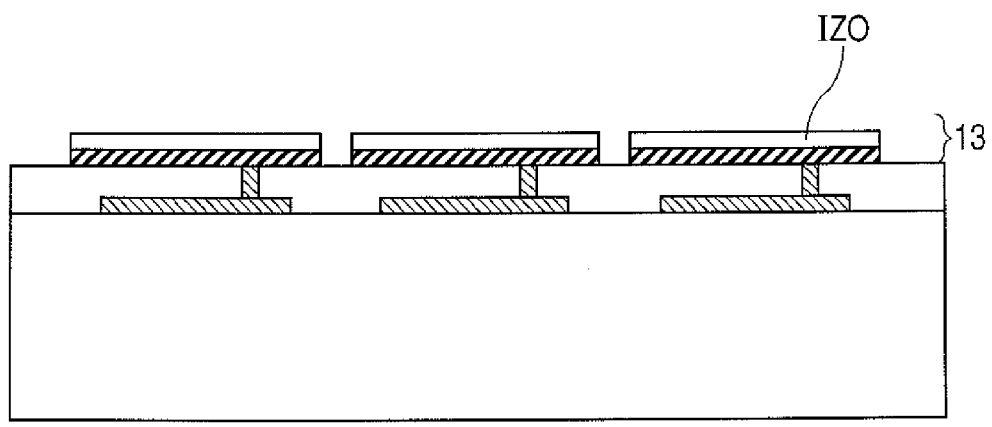
FIG. 16 is a sectional view of a structure of a lower electrode according to Example 2 of the present invention.

FIG. 16 illustrates Example 2 of the present invention.
FIG. 16 corresponds to FIG. 6 of Example 1.
In this example, the light reflective cathode 13 for each color is formed using an Ag alloy (AgPdCu) film with a thickness of 10 nm and an IZO film formed thereon with a thickness of 10 nm. In association with this, as an electron injecting layer, a layer (not shown) obtained by subjecting Alq to co-deposition from the vapor using cesium carbonate ($Cs_2Co_3$) is formed on the IZO film with a thickness of 10 nm.

Therefore, the optical distance between the light emitting surface and the reflection surface is increased by the sum of a product of the thickness of the IZO film and the refractive index (10 nm×2.0) and a product of the thickness of the electron injecting layer and the refractive index (10 nm×1.8). Specifically, the optical distance (d) from the light emitting surface to the reflection surface according to the present invention is the sum of 2.0 times the thickness of the IZO film and 1.8 times a sum of the thickness of the electron injecting layer, the thickness of the electron transporting layer, and the thickness of the light emitting layer.

Thus, each thickness of the light emitting layers 17R, 17G, and 17B can be obtained by the following expression (where h is an integer larger than 1).

$$d_{Red} \approx 10 \times 2.0 + (10 + 20 + T_{Red}) \times 1.8 \approx \lambda_{Red}/4 \times (2h-1)$$

$$d_{Green} \approx 10 \times 2.0 + (10 + 20 + T_{Green}) \times 1.8 \approx \lambda_{Green}/4 \times (2h-1)$$

$$d_{Blue} \approx 10 \times 2.0 + (10 + 20 + T_{Blue}) \times 1.8 \approx \lambda_{Blue}/4 \times (2h-1)$$

Assuming that h is 1 in this example, setting is performed such that the thickness of the light emitting layer 17R is 45 nm, the thickness of the light emitting layer 17G is 35 nm, and the thickness of the light emitting layer 17B is 25 nm.

As a result, with respect to the respective colors, as in Example 1, the optical distance from the light emitting surface to the reflection surface is able to be optimized, and the external light extraction efficiency enhancing effects owing to the interference effect is obtained.

In addition, the use of an Ag alloy having a reflectivity more excellent than that of Al for a reflection layer enhances the extraction efficiency.

Further, it is found that the material of the cathode 13 can also be selected from a wide range of materials.

Further, the IZO film having a resistance lower than that of the organic layer is additionally formed on the reflective side, so each organic light emitting device is able to be driven at a low voltage.

EXAMPLE 3

Figure 17:
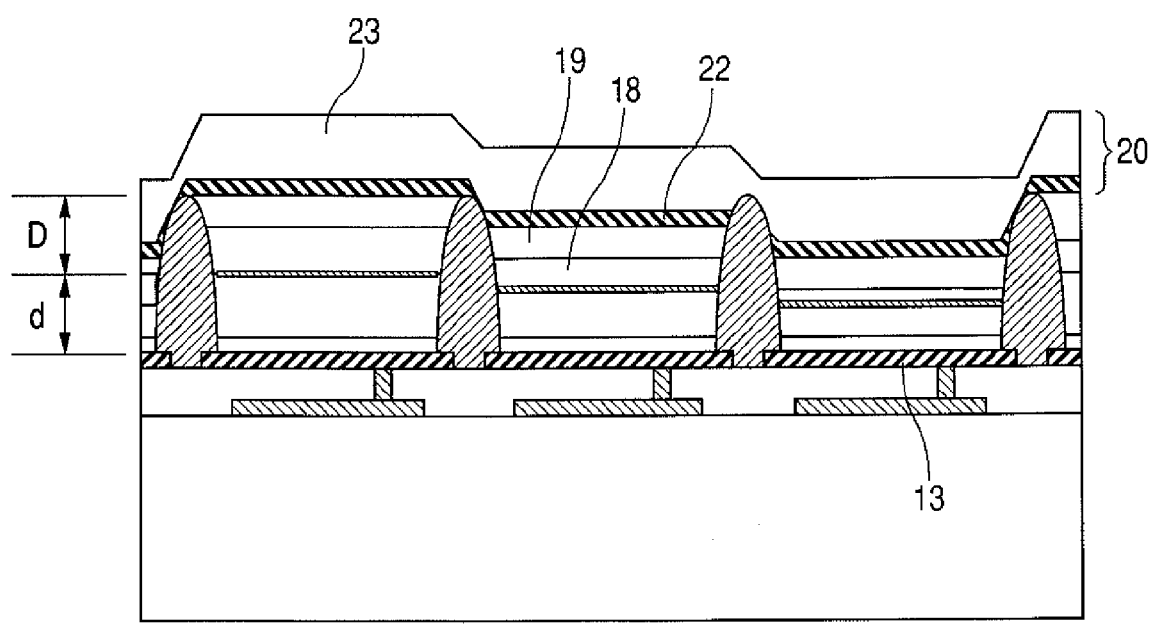
FIG. 17 is a sectional view for explaining a part of a multicolor organic light emitting apparatus according to Example 3 of the present invention.

FIG. 17 shows Example 3 of the present invention.
In this example, a small resonator structure is used.
In this example, the hole injecting layer 19 is manufactured by the processes shown in FIGS. 5 to 12 in the same manner as in Example 1 except for the thickness of the hole transporting layer 18. After that, an Ag film having a thickness of 10 nm is deposited from the vapor through resistance heating, part of light emission is transmitted, and the part of the light emission is reflected, to thereby form a semi-reflective electrode 22 including a semi-reflective layer (not shown).

Next, in order to reduce the resistance of the upper electrode 20, on the semi-reflective electrode 22, an IZO film having a thickness of 100 nm is formed as a transparent conductive layer 23 by sputtering. As a result, the upper electrode 20 of this example is formed of the Ag film having the thickness of 10 nm and the IZO film having the thickness of 100 nm.

The semi-reflective electrode 22 constitutes a small resonator formed together with the light reflective cathode 13. As functions of the small resonator, light having a desired wavelength can be selectively extracted owing to the optical interference effect.

Thus, a multicolor organic light emitting apparatus having a high color purity can be attained. Note that, in order to obtain the multicolor organic light emitting apparatus, an optical distance between resonant mirrors (between the semi-reflective electrode 22 and the reflection surface of the cathode 13) must be an integral multiple of $\lambda/2$ when the peak wavelength of light emission is represented by $\lambda$.

In this example, conditions for forming layers from the light emitting surfaces to the reflection surface of the cathode 13 are the same as those of Example 1. Thus, the optical distance (d) from each light emitting surface for R, G, and B to the reflection surface is set to be substantially equal to 1/4 times the peak wavelength ($\lambda$) for the corresponding luminescent color as described above.

Next, an optical distance (D) from each light emitting surface of the light emitting layers 17R, 17G, and 17B for the respective colors to the semi-reflective electrode 22 is discussed.

In this example, the optical distance (D) from each light emitting surface for each color to the reflection surface of the semi-reflective electrode 22 is set to be equal to 1/4 times the peak wavelength ($\lambda$) for the corresponding luminescent color.

For this reason, each thickness of the hole transporting layers 18 are set as follows.

Specifically, the hole transporting layers 18 corresponding to R, G, and B are formed by being subjected to patterning using shadow masks with thicknesses of 45 nm, 35 nm, and 25 nm, respectively. Further, the hole injecting layer 19 is formed by being subjected to patterning using a shadow mask with a thickness of 40 nm.

The semi-reflective electrode 22 also functions as a protective layer with respect to the hole injecting layer 19 when the IZO film is formed thereon by sputtering, so formation of another protective layer is omitted in this example.

Each refractive index of the light emitting layers 17R, 17G, 17B is substantially equal to 1.8, so the optical distance (D) from each light emitting surface for the corresponding color to the reflection surface of the semi-reflective electrode 22 is represented by the following expressions.

$$D_{Red}=(40+45)\times 1.8=153 \text{ nm}$$

$$D_{Green}=(40+35)\times 1.8=135 \text{ nm}$$

$$D_{Blue}=(40+25)\times 1.8=117 \text{ nm}$$

Those values are substantially equal to 1/4 times the emission wavelength peaks for R, G, and B ($\lambda_{Red}/4=155$ nm, $\lambda_{Red}/4=133$ nm, and $\lambda_{Red}/4=120$ nm) as shown in Example 1.

As a result, the optical distance (d+D) between resonant mirrors satisfies the condition of the small resonator structure, that is, $\lambda/2$ times with respect to each of R, G, and B, which is effective in that the extraction efficiency of light having a desired wavelength is enhanced.

According to this example of the present invention, when a small resonator structure is used, there is also an effect in that an optical distance is optimized with ease, luminance is improved, and color purity is improved.

The optical distance between the light emitting surface and the reflection surface can be optimized for R, G, and B, only through adjustment of each thickness of light emitting layers for R, G, and B, which can be utilized in a multicolor organic light emitting apparatus with a desirable light extraction efficiency obtained through mutual enhancement by optical interference.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2006-090537, filed Mar. 29, 2006 and 2007-069971, filed Mar. 19, 2007, which are hereby incorporated by reference herein in their entirety.

What is claimed is:

1. A multicolor organic light emitting apparatus of a top-emission type, comprising:
   a substrate; and
   a plurality of organic light emitting devices which is formed on the substrate and comprises a first organic light emitting device for exhibiting a first luminescent color and a second organic light emitting device for exhibiting a second luminescent color which is different from the first luminescent color, wherein:
   the first organic light emitting device includes a light reflective cathode, an organic compound layer which contains a light emitting layer having an electron transportability, and a light transmissive anode formed in the stated order from a side of the substrate;
   the second organic light emitting device includes a light reflective cathode, an organic compound layer containing a light emitting layer which has an electron transportability and is formed with a material and a thickness different from those of the light emitting layer of the first organic light emitting device, and a light transmissive anode formed in the stated order from the side of the substrate;
   a thickness of a layer formed between the light emitting layer and a reflection surface of the cathode is the same as that of each of the first organic light emitting device and the second organic light emitting device; and
   an optical distance between a light emitting surface of each of the light emitting layers and the reflection surface of the cathode is adjusted such that each thickness of the light emitting layers is varied to enhance light emitted from the light emitting layers by optical interference.

2. The multicolor organic light emitting apparatus according to claim 1, wherein the optical distance between the light emitting surface of each of the light emitting layers and the reflection surface of the cathode is adjusted to satisfy the following expression:

$$2L=n\lambda+(\Phi/2\pi)\lambda$$

where n represents a positive integer, $\Phi$ represents a phase shift on the reflection surface of the cathode, and $\lambda$ represents a peak wavelength of a PL spectrum of the light emitting layer.

3. The multicolor organic light emitting apparatus according to claim 1, wherein the layer formed between the light emitting layer and the reflection surface of the cathode is continuously formed over the first organic light emitting device and the second organic light emitting device.

4. The multicolor organic light emitting apparatus according to claim 1, wherein a thickness of a layer formed between the light emitting layer of each of the organic light emitting devices and the anode is the same as that of each of the first organic light emitting device and the second organic light emitting device.

5. The multicolor organic light emitting apparatus according to claim 4, wherein the layer formed between the light emitting layer of each of the organic light emitting devices and the anode is continuously formed over the first organic light emitting device and the second organic light emitting device.

6. The multicolor organic light emitting apparatus according to claim 1, wherein:
   each of the plurality of organic light emitting devices includes a third organic light emitting device for exhibiting a third luminescent color which is different from the first luminescent color and the second luminescent color;
   the third organic light emitting device includes a light reflective cathode, an organic compound layer containing a light emitting layer which has an electron transportability and is formed with a material and a thickness different from those of the light emitting layers of the first organic light emitting device and the second organic light emitting device, and a light transmissive anode formed in the stated order from the side of the substrate;
   a thickness of a layer formed between the light emitting layer and a reflection surface of the cathode is the same as that of each of the first organic light emitting device, the second organic light emitting device, and the third organic light emitting device; and
   an optical distance between a light emitting surface of each of the light emitting layers and the reflection surface of the cathode is adjusted such that each thickness of the light emitting layers is varied to enhance light emitted from the light emitting layers by optical interference.

7. The multicolor organic light emitting apparatus according to claim 6, wherein the layer formed between the light emitting layer and the reflection surface of the cathode is continuously formed over the first organic light emitting device, the second organic light emitting device, and the third organic light emitting device.

8. The multicolor organic light emitting apparatus according to claim 6, wherein a thickness of a layer formed between the light emitting layer of each of the organic light emitting devices and the anode is the same as that of each of the first organic light emitting device, the second organic light emitting device, and the third organic light emitting device.

9. The multicolor organic light emitting apparatus according to claim 6, wherein a layer formed between the light emitting layer of each of the organic light emitting devices and the anode is continuously formed over the first organic light emitting device, the second organic light emitting device, and the third organic light emitting device.

10. The multicolor organic light emitting apparatus according to claim 1, further comprising a thin film transistor for driving each of the organic light emitting devices, which is formed between the substrate and each of the organic light emitting devices, the thin film transistor being an n-channel type transistor.

11. The multicolor organic light emitting apparatus according to claim 10, wherein the thin film transistor includes a semiconductor layer formed of an amorphous silicon.

12. A multicolor organic light emitting apparatus of a bottom-emission type, comprising:
a substrate; and
a plurality of organic light emitting devices which is formed on the substrate and includes a first organic light emitting device for exhibiting a first luminescent color and a second organic light emitting device for exhibiting a second luminescent color which is different from the first luminescent color, wherein:
the first organic light emitting device includes a light transmissive cathode, an organic compound layer which contains a light emitting layer having a hole transportability, and a light reflective anode formed in the stated order from a side of the substrate;
the second organic light emitting device includes a light transmissive cathode, an organic compound layer containing a light emitting layer which has a hole transportability and is formed with a material and a thickness different from those of the light emitting layer of the first organic light emitting device, and a light reflective anode formed in the stated order from the side of the substrate;
a thickness of a layer formed between the light emitting layer and a reflection surface of the anode is the same as that of each of the first organic light emitting device and the second organic light emitting device; and
an optical distance between a light emitting surface of each of the light emitting layers and the reflection surface of the anode is adjusted such that each thickness of the light emitting layers is varied to enhance light emitted from the light emitting layers by optical interference.

13. The multicolor organic light emitting apparatus according to claim 12, wherein the optical distance between the light emitting surface of each of the light emitting layers and the reflection surface of the anode is adjusted to satisfy the following expression:

$$2L = n\lambda + (\Phi/2\pi)\lambda$$

where n represents a positive integer, $\Phi$ represents a phase shift on the reflection surface of the anode, and $\lambda$ represents a peak wavelength of a PL spectrum of the light emitting layer.

14. The multicolor organic light emitting apparatus according to claim 12, wherein the layer formed between the light emitting layer and the reflection surface of the anode is continuously formed over the first organic light emitting device and the second organic light emitting device.

15. The multicolor organic light emitting apparatus according to claim 12, wherein a thickness of a layer formed between the light emitting layer of each of the organic light emitting devices and the cathode is the same as that of each of the first organic light emitting device and the second organic light emitting device.

16. The multicolor organic light emitting apparatus according to claim 15, wherein the layer formed between the light emitting layer of each of the organic light emitting devices and the cathode is continuously formed over the first organic light emitting device and the second organic light emitting device.

17. The multicolor organic light emitting apparatus according to claim 12, wherein:
each of the plurality of organic light emitting devices includes a third organic light emitting device for exhibiting a third luminescent color which is different from the first luminescent color and the second luminescent color;
the third organic light emitting device includes a light transmissive cathode, an organic compound layer containing a light emitting layer which has a hole transportability and is formed with a material and a thickness different from those of the light emitting layers of the first organic light emitting device and the second organic light emitting device, and a light reflective anode formed in the stated order from the side of the substrate;
a thickness of a layer formed between the light emitting layer and a reflection surface of the anode is the same as that of each of the first organic light emitting device, the second organic light emitting device, and the third organic light emitting device; and
an optical distance between a light emitting surface of each of the light emitting layers and the reflection surface of the anode is adjusted such that each thickness of the light emitting layers is varied to enhance light emitted from the light emitting layers by optical interference.

18. The multicolor organic light emitting apparatus according to claim 17, wherein the layer formed between the light emitting layer and the reflection surface of the anode is continuously formed over the first organic light emitting device, the second organic light emitting device, and the third organic light emitting device.

19. The multicolor organic light emitting apparatus according to claim 17, wherein a thickness of a layer formed between the light emitting layer of each of the organic light emitting devices and the cathode is the same as that of each of the first organic light emitting device, the second organic light emitting device, and the third organic light emitting device.

20. The multicolor organic light emitting apparatus according to claim 17, wherein a layer formed between the light emitting layer of each of the organic light emitting devices and the cathode is continuously formed over the first organic light emitting device, the second organic light emitting device, and the third organic light emitting device.

21. The multicolor organic light emitting apparatus according to claim 12, further comprising a thin film transistor for driving each of the organic light emitting devices, which is formed between the substrate and each of the organic light emitting devices, the thin film transistor being an n-channel type transistor.

22. The multicolor organic light emitting apparatus according to claim 21, wherein the thin film transistor includes a semiconductor layer formed of an amorphous silicon.

23. A multicolor organic light emitting apparatus of a top-emission type, comprising:

a substrate; and a plurality of organic light emitting devices which is formed on the substrate and includes a first organic light emitting device for exhibiting a first luminescent color and a second organic light emitting device for exhibiting a second luminescent color which is different from the first luminescent color, wherein:

the first organic light emitting device includes a light reflective anode, an organic compound layer which contains a light emitting layer having a hole transportability, and a light transmissive cathode formed in the stated order from a side of the substrate;

the second organic light emitting device includes a light reflective anode, an organic compound layer containing a light emitting layer which has a hole transportability and is formed with a material and a thickness different from those of the light emitting layer of the first organic light emitting device, and a light transmissive cathode formed in the stated order from the side of the substrate;

a thickness of a layer formed between the light emitting layer and a reflection surface of the anode is the same as that of each of the first organic light emitting device and the second organic light emitting device; and an optical distance between a light emitting surface of each of the light emitting layers and the reflection surface of the anode is adjusted such that each thickness of the light emitting layers is varied to enhance light emitted from the light emitting layers by optical interference.

24. The multicolor organic light emitting apparatus according to claim 23, wherein the optical distance between the light emitting surface of each of the light emitting layers and the reflection surface of the anode is adjusted to satisfy the following expression:

$$2L = n\lambda + (\Phi/2\pi)\lambda$$

where n represents a positive integer, $\Phi$ represents a phase shift on the reflection surface of the anode, and $\lambda$ represents a peak wavelength of a PL spectrum of the light emitting layer.

25. The multicolor organic light emitting apparatus according to claim 23, wherein the layer formed between the light emitting layer and the reflection surface of the anode is continuously formed over the first organic light emitting device and the second organic light emitting device.

26. The multicolor organic light emitting apparatus according to claim 23, wherein a thickness of a layer formed between the light emitting layer of each of the organic light emitting devices and the cathode is the same as that of each of the first organic light emitting device and the second organic light emitting device.

27. The multicolor organic light emitting apparatus according to claim 26, wherein the layer formed between the light emitting layer of each of the organic light emitting devices and the cathode is continuously formed over the first organic light emitting device and the second organic light emitting device.

28. The multicolor organic light emitting apparatus according to claim 23, wherein:

each of the plurality of organic light emitting devices includes a third organic light emitting device for exhibiting a third luminescent color which is different from the first luminescent color and the second luminescent color;

the third organic light emitting device includes a light reflective anode, an organic compound layer containing a light emitting layer which has a hole transportability and is formed with a material and a thickness different from those of the light emitting layers of the first organic light emitting device and the second organic light emitting device, and a light transmissive cathode formed in the stated order from the side of the substrate;

a thickness of a layer formed between the light emitting layer and a reflection surface of the anode is the same as that of each of the first organic light emitting device, the second organic light emitting device, and the third organic light emitting device; and an optical distance between a light emitting surface of each of the light emitting layers and the reflection surface of the anode is adjusted such that each thickness of the light emitting layers is varied to enhance light emitted from the light emitting layers by optical interference.

29. The multicolor organic light emitting apparatus according to claim 28, wherein the layer formed between the light emitting layer and the reflection surface of the anode is continuously formed over the first organic light emitting device, the second organic light emitting device, and the third organic light emitting device.

30. The multicolor organic light emitting apparatus according to claim 28, wherein a thickness of a layer formed between the light emitting layer of each of the organic light emitting devices and the cathode is the same as that of each of the first organic light emitting device, the second organic light emitting device, and the third organic light emitting device.

31. The multicolor organic light emitting apparatus according to claim 28, wherein a layer formed between the light emitting layer of each of the organic light emitting devices and the cathode is continuously formed over the first organic light emitting device, the second organic light emitting device, and the third organic light emitting device.

32. A multicolor organic light emitting apparatus of a bottom-emission type, comprising:

a substrate; and a plurality of organic light emitting devices which is formed on the substrate and includes a first organic light emitting device for exhibiting a first luminescent color and a second organic light emitting device for exhibiting a second luminescent color which is different from the first luminescent color, wherein:

the first organic light emitting device includes a light transmissive anode, an organic compound layer which contains a light emitting layer having an electron transportability, and a light reflective cathode formed in the stated order from a side of the substrate;

the second organic light emitting device includes a light transmissive anode, an organic compound layer containing a light emitting layer which has an electron transportability and is formed with a material and a thickness different from those of the light emitting layer of the first organic light emitting device, and a light reflective cathode formed in the stated order from the side of the substrate;

a thickness of a layer formed between the light emitting layer and a reflection surface of the cathode is the same as that of each of the first organic light emitting device and the second organic light emitting device; and an optical distance between a light emitting surface of each of the light emitting layers and the reflection surface of the cathode is adjusted such that each thickness of the light emitting layers is varied to enhance light emitted from the light emitting layers by optical interference.

33. The multicolor organic light emitting apparatus according to claim 32, wherein the optical distance between the light emitting surface of each of the light emitting layers and the reflection surface of the cathode is adjusted to satisfy the following expression:

$$2L = n\lambda + (\Phi/2\pi)\lambda$$

where n represents a positive integer, $\Phi$ represents a phase shift on the reflection surface of the cathode, and $\lambda$ represents a peak wavelength of a PL spectrum of the light emitting layer.

34. The multicolor organic light emitting apparatus according to claim 32, wherein the layer formed between the light emitting layer and the reflection surface of the cathode is continuously formed over the first organic light emitting device and the second organic light emitting device.

35. The multicolor organic light emitting apparatus according to claim 32, wherein a thickness of a layer formed between the light emitting layer of each of the organic light emitting devices and the anode is the same as that of each of the first organic light emitting device and the second organic light emitting device.

36. The multicolor organic light emitting apparatus according to claim 35, wherein the layer formed between the light emitting layer of each of the organic light emitting devices and the anode is continuously formed over the first organic light emitting device and the second organic light emitting device.

37. The multicolor organic light emitting apparatus according to claim 32, wherein:

each of the plurality of organic light emitting devices includes a third organic light emitting device for exhibiting a third luminescent color which is different from the first luminescent color and the second luminescent color;

the third organic light emitting device includes a light transmissive anode, an organic compound layer containing a light emitting layer which has an electron transportability and is formed with a material and a thickness different from those of the light emitting layers of the first organic light emitting device and the second organic light emitting device, and a light reflective cathode formed in the stated order from side of the substrate;

a thickness of a layer formed between the light emitting layer and a reflection surface of the cathode is the same as that of each of the first organic light emitting device, the second organic light emitting device, and the third organic light emitting device; and an optical distance between a light emitting surface of each of the light emitting layers and the reflection surface of the cathode is adjusted such that each thickness of the light emitting layers is varied to enhance light emitted from the light emitting layers by optical interference.

38. The multicolor organic light emitting apparatus according to claim 37, wherein the layer formed between the light emitting layer and the reflection surface of the cathode is continuously formed over the first organic light emitting device, the second organic light emitting device, and the third organic light emitting device.

39. The multicolor organic light emitting apparatus according to claim 37, wherein a thickness of a layer formed between the light emitting layer of each of the organic light emitting devices and the anode is the same as that of each of the first organic light emitting device, the second organic light emitting device, and the third organic light emitting device.

40. The multicolor organic light emitting apparatus according to claim 37, wherein a layer formed between the light emitting layer of each of the organic light emitting devices and the anode is continuously formed over the first organic light emitting device, the second organic light emitting device, and the third organic light emitting device.

* * * * *